United States Patent
Hirano et al.

(10) Patent No.: US 10,081,577 B2
(45) Date of Patent: Sep. 25, 2018

(54) CUBIC BORON NITRIDE SINTERED BODY AND COATED CUBIC BORON NITRIDE SINTERED BODY

(71) Applicant: TUNGALOY CORPORATION, Iwaki-shi, Fukushima (JP)

(72) Inventors: Yusuke Hirano, Iwaki (JP); Kentaro Shiro, Iwaki (JP)

(73) Assignee: TUNGALOY CORPORATION, Iwaki-Shi, Fukushima (JP)

( * ) Notice: Subject to any disclaimer, the term of this patent is extended or adjusted under 35 U.S.C. 154(b) by 0 days.

(21) Appl. No.: 15/538,604

(22) PCT Filed: Dec. 24, 2015

(86) PCT No.: PCT/JP2015/085938
§ 371 (c)(1),
(2) Date: Jun. 21, 2017

(87) PCT Pub. No.: WO2016/104563
PCT Pub. Date: Jun. 30, 2016

(65) Prior Publication Data
US 2017/0362130 A1 Dec. 21, 2017

(30) Foreign Application Priority Data
Dec. 24, 2014 (JP) .................... 2014-260805

(51) Int. Cl.
C04B 35/5831 (2006.01)
B23B 27/18 (2006.01)
(Continued)

(52) U.S. Cl.
CPC .......... *C04B 35/5831* (2013.01); *B23B 27/14* (2013.01); *B23B 27/18* (2013.01);
(Continued)

(58) Field of Classification Search
CPC ..... C04B 35/5831; C04B 41/87; C04B 41/89; B23B 27/148
See application file for complete search history.

(56) References Cited

U.S. PATENT DOCUMENTS 8,814,965 B2 * 8/2014 Yokoshi ............... C04B 35/119 51/293
9,856,175 B2 * 1/2018 Okamura ........... C04B 35/5831
(Continued)

FOREIGN PATENT DOCUMENTS

EP 0694500 A1 1/1996
EP 3 153 485 A1 4/2017

OTHER PUBLICATIONS

International Search Report dated Jan. 26, 2016 issued in PCT counterpart application (No. PCT/JP2015/085938).
(Continued)

Primary Examiner — Karl E Group
(74) Attorney, Agent, or Firm — Foley & Lardner LLP

(57) ABSTRACT

A cBN sintered body has 40%-85% cBN by volume and 15% to 60% binder phase by volume. and inevitable impurities. The binder phase has an Al compound including Al and at least one element selected from N, O and B, and a Zr compound including Zr and at least one element selected from C, N, O and B. The Zr compound includes ZrO, or ZrO and $ZrO_2$. In an X-ray diffraction, where a peak intensity of a (111) plane of the ZrO is $I_1$, a peak intensity of a (101) plane of tetragonal $ZrO_2$ is $I_{2t}$, and a peak intensity of a (111) plane of cubic $ZrO_2$ is $I_{2c}$, a ratio of the intensity of $I_1$ to total intensities of $I_1$, $I_{2t}$ and $I_{2c}$ is 0.6-1.0, and an average grain size of the Al compound is 80 nm-300 nm.

13 Claims, 1 Drawing Sheet

(51) Int. Cl.
  *C04B 41/87* (2006.01)
  *B23B 27/14* (2006.01)
  *B23B 27/20* (2006.01)
  *C04B 41/89* (2006.01)
  *C04B 35/63* (2006.01)
  *C04B 41/00* (2006.01)
  *C04B 41/50* (2006.01)
  *C04B 35/119* (2006.01)
  *C04B 35/626* (2006.01)
  *C04B 35/645* (2006.01)
  *C23C 14/18* (2006.01)

(52) U.S. Cl.
  CPC ............ *B23B 27/20* (2013.01); *C04B 35/119* (2013.01); *C04B 35/6262* (2013.01); *C04B 35/62685* (2013.01); *C04B 35/6303* (2013.01); *C04B 35/645* (2013.01); *C04B 41/009* (2013.01); *C04B 41/5063* (2013.01); *C04B 41/5068* (2013.01); *C04B 41/87* (2013.01); *C04B 41/89* (2013.01); *C04B 2235/3217* (2013.01); *C04B 2235/3225* (2013.01); *C04B 2235/3244* (2013.01); *C04B 2235/3246* (2013.01); *C04B 2235/386* (2013.01); *C04B 2235/3813* (2013.01); *C04B 2235/3826* (2013.01); *C04B 2235/3839* (2013.01); *C04B 2235/3865* (2013.01); *C04B 2235/3886* (2013.01); *C04B 2235/402* (2013.01); *C04B 2235/5436* (2013.01); *C04B 2235/6581* (2013.01); *C04B 2235/785* (2013.01); *C04B 2235/786* (2013.01); *C04B 2235/80* (2013.01); *C23C 14/18* (2013.01)

(56) References Cited

U.S. PATENT DOCUMENTS

| | | |
|---|---|---|
| 2012/0208006 A1 | 8/2012 | Okamura et al. |
| 2012/0304544 A1 | 12/2012 | Yokoshi |
| 2012/0329632 A1 | 12/2012 | Malik et al. |
| 2017/0197885 A1* | 7/2017 | Okamura ............ C04B 35/5831 |

OTHER PUBLICATIONS

Written Opinion dated Jan. 26, 2016 issued in PCT counterpart application (No. PCT/JP2015/085938).

European Patent Application, "Communication with Extended European Search Report," issued in connection with European Patent Application No. 15 873 131.5, dated Jun. 21, 2018.

* cited by examiner

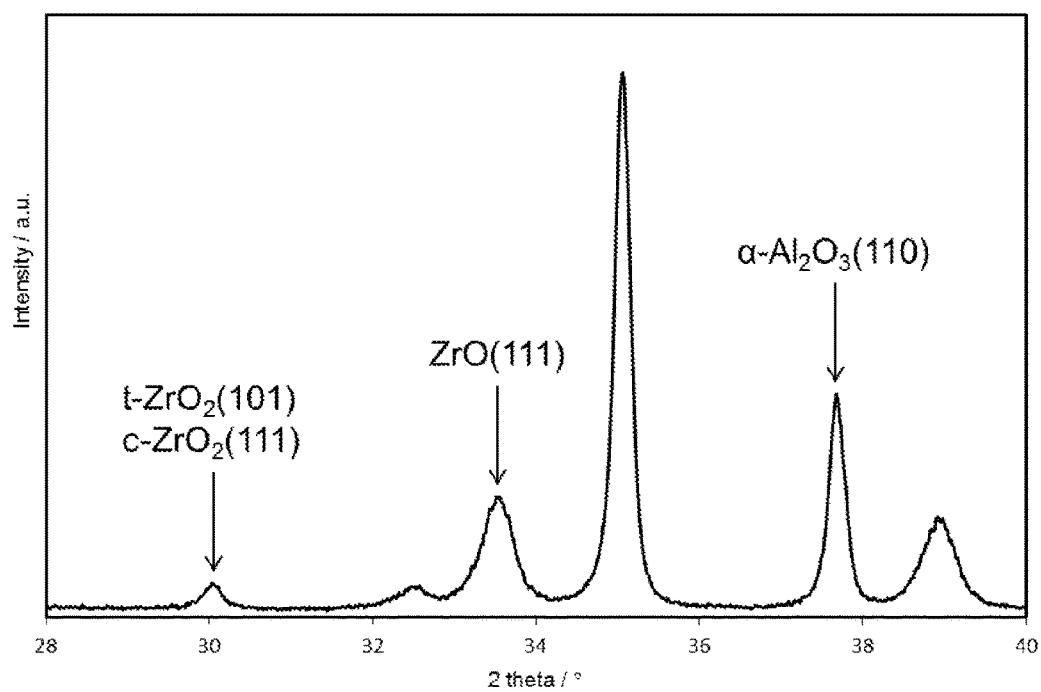

CUBIC BORON NITRIDE SINTERED BODY AND COATED CUBIC BORON NITRIDE SINTERED BODY

RELATED APPLICATIONS

This is a 371 US National Phase of International Patent Application No. PCT/JP2015/085938 filed Dec. 24, 2015, which published as WO2016/104563A1 on Jun. 30, 2016, and which claims priority to JP 2014-260805, filed Dec. 24, 2014. The contents of the aforementioned applications are incorporated by reference in their entirety.

TECHNICAL FIELD

The present invention relates to a cubic boron nitride sintered body and a coated cubic boron nitride sintered body. More specifically, the present invention relates to a cubic boron nitride sintered body and a coated cubic boron nitride sintered body suitable for a cutting tool and a wear resistant tool.

BACKGROUND ART

The cubic boron nitride has hardness next to the diamond and excellent thermal conductivity. In addition, the cubic boron nitride has a characteristic that it has low affinity with iron. A cubic boron nitride sintered body comprising cubic boron nitride, and a binder phase of a metal(s) and/or ceramics has been applied to a cutting tool and a wear resistant tool, etc.

For example, as a prior art of the cubic boron nitride sintered body, there is a cubic boron nitride sintered body comprising cubic boron nitride and at least α-$Al_2O_3$ and a Zr compound as a binder phase (see Patent Document 1.).

PRIOR ART DOCUMENT

Patent Document

Patent Document 1: WO2011/059020A

SUMMARY OF THE INVENTION

Problems to be Solved by the Invention

In order to raise machining efficiency, cutting conditions have been becoming more severe than in the past, and it has been required to lengthen the tool life more than before. However, in the processing of a hard-to-cut material such as a nickel-based heat resistant alloy and a cobalt-based heat resistant alloy, etc., the cubic boron nitride sintered body containing $Al_2O_3$ and the Zr compound disclosed in the invention of the above-described Patent Document 1 involved the problem that wear resistance was not sufficient and the processing time was short.

The present invention is to solve such problems. That is, an object of the present invention is to provide a cubic boron nitride sintered body and a coated cubic boron nitride sintered body, which can elongate tool life of a cutting tool and a wear resistant tool by improving wear resistance without lowering fracture resistance.

Means to Solve the Problems

The present inventors have studied on the cubic boron nitride sintered body, and as a result, they have found that for improving fracture resistance of the cubic boron nitride sintered body in high-speed processing and high efficiency processing of a hard-to-cut material, it is important to suppress wear by chemical reaction and to suppress flank wear. The present inventors have also found that for suppressing wear by chemical reaction, it is effective not to lower oxidation resistance of the cubic boron nitride sintered body. The present inventors have further found that for suppressing flank wear, it is effective to improve hardness of the cubic boron nitride sintered body. The present inventors have accomplished the present invention based on these findings.

The summary of the present invention is as follows.

(1) A cubic boron nitride sintered body comprising: a cubic boron nitride with 40% by volume or more and 85% by volume or less; a binder phase with 15% by volume or more and 60% by volume or less; and inevitable impurities, wherein the binder phase comprises:

an Al compound comprising an Al element and at least one element selected from the group consisting of N, O and B; and a Zr compound comprising a Zr element and at least one element selected from the group consisting of C, N, O and B, the Zr compound comprises ZrO, or ZrO and $ZrO_2$, when a peak intensity of a (111) plane of the ZrO is represented as $I_1$, a peak intensity of a (101) plane of tetragonal $ZrO_2$ is represented as $I_{2t}$, and a peak intensity of a (111) plane of cubic $ZrO_2$ is represented as $I_{2c}$ in an X-ray diffraction, a ratio $[I_1/(I_1+I_{2t}+I_{2c})]$ of the intensity of $I_1$ based on a sum of the intensities of $I_1$, $I_{2t}$ and $I_{2c}$ is 0.6 or more and 1.0 or less, and an average grain size of the Al compound is 80 nm or more and 300 nm or less.

(2) The cubic boron nitride sintered body of (1), wherein the Al compound comprises $Al_2O_3$,
a crystal structure of the $Al_2O_3$ is α-$Al_2O_3$, and
when a peak intensity of a (110) plane of the α-$Al_2O_3$ is represented as $I_3$ in an X-ray diffraction, a ratio $[I_1/I_3]$ of the intensity of $I_1$ based on the intensity of $I_3$ is 0.3 or more and 0.8 or less.

(3) The cubic boron nitride sintered body of (1) or (2), wherein the Zr compound is 1% by volume or more and 10% by volume or less based on the whole cubic boron nitride sintered body.

(4) The cubic boron nitride sintered body of any one of (1) to (3), wherein an average particle size of the cubic boron nitride is 0.2 μm or more and 2.0 μm or less.

(5) A coated cubic boron nitride sintered body comprising the cubic boron nitride sintered body of any one of (1) to (4), and a film formed onto the surface thereof.

(6) The coated cubic boron nitride sintered body of (5), wherein the film comprises at least one or more elements selected from the group consisting of Ti, Zr, Hf, V, Nb, Ta, Cr, Mo, W, Al and Si, and at least one or more elements selected from the group consisting of C, N, O and B.

(7) The coated cubic boron nitride sintered body of (5) or (6), wherein the film is a single layer film or a laminated film of two or more layers.

(8) The coated cubic boron nitride sintered body of any one of (5) to (7), wherein an average film thickness of a whole film is 0.5 μm or more and 20 μm or less.

Effects of the Invention

The cubic boron nitride sintered body and the coated cubic boron nitride sintered body of the present invention are excellent in wear resistance. Therefore, when the cubic boron nitride sintered body and the coated cubic boron nitride sintered body of the present invention are used as a cutting tool and a wear resistant tool, tool life can be elongated.

BRIEF DESCRIPTION OF THE DRAWING

The FIGURE is a drawing showing a pattern of the X-ray diffraction measurement result of the cubic boron nitride sintered body of Present product 7.

EMBODIMENTS TO CARRY OUT THE INVENTION

The cubic boron nitride sintered body of the present invention comprises 40% by volume or more and 85% by volume or less of cubic boron nitride, 15% by volume or more and 60% by volume or less of a binder phase, and inevitable impurities. If the cubic boron nitride contained in the cubic boron nitride sintered body of the present invention is less than 40% by volume, and the binder phase exceeds 60% by volume, strength of the cubic boron nitride sintered body is lowered in the processing of a hard-to-cut material, so that fracture resistance is lowered. On the other hand, if the cubic boron nitride exceeds 85% by volume, and the binder phase is less than 15% by volume, wear by chemical reaction proceeds in the processing of a hard-to-cut material, so that fracture resistance is lowered.

The binder phase contained in the cubic boron nitride sintered body of the present invention contains an Al compound and a Zr compound. The Al compound contains an Al element and at least one element selected from the group consisting of N, O and B. The Zr compound contains a Zr element and at least one element selected from the group consisting of C, N, O and B.

The binder phase contained in the cubic boron nitride sintered body of the present invention may be constituted by the Al compound and the Zr compound alone. In addition, the binder phase may further contain, in addition to the Al compound and the Zr compound, at least one metal selected from the group consisting of Ti, Hf, V, Nb, Ta, Cr, Mo, Si, W, Co and Ni and/or a compound comprising at least one kind of the metal and at least one element selected from the group consisting of C, N, O and B. However, the binder phase contained in the cubic boron nitride sintered body of the present invention preferably comprises the Al compound and the Zr compound alone since the cubic boron nitride sintered body with excellent wear resistance by chemical reaction and toughness can be obtained.

The binder phase other than the Al compound and the Zr compound contained in the cubic boron nitride sintered body of the present invention may be, for example, TiN, TiCN, $TiB_2$, $HfO_2$, NbN, TaN, $Cr_3C_2$, Mo, $Mo_2C$, WC, $W_2Co_{21}B_6$, SiC, Co, CoWB, $Co_3W_3C$ and Ni, etc.

The Al compound contained in the cubic boron nitride sintered body of the present invention may be, for example, $Al_2O_3$, AlN and $AlB_2$, etc. Among these, the Al compound preferably contains $Al_2O_3$ since it can enlarge the effect of suppressing wear by chemical reaction of the cubic boron nitride sintered body.

When the average grain size of the Al compound contained in the cubic boron nitride sintered body of the present invention is 80 nm or more and 300 nm or less, strength of the cubic boron nitride sintered body is improved, so that the cubic boron nitride sintered body with excellent fracture resistance can be obtained. When the average grain size of the Al compound is 80 nm or less, the particles of the Al compound are dropped, so that wear resistance is lowered. On the other hand, when the average grain size of the Al compound is 300 nm or more, strength of the cubic boron nitride sintered body is lowered, so that fracture resistance is lowered. Among these, the average grain size of the Al compound is further preferably 80 nm or more and 200 nm or less.

The Zr compound contained in the cubic boron nitride sintered body of the present invention may be, for example, $ZrO_2$, ZrO, ZrN, ZrCN and $ZrB_2$, etc. Among these, when the Zr compound contains ZrO, or ZrO and $ZrO_2$, the cubic boron nitride sintered body with excellent wear resistance and fracture resistance can be obtained. Among these, it is preferred that it contains ZrO and $ZrO_2$. In such a case, the cubic boron nitride sintered body that is excellent in the balance of wear resistance and fracture resistance can be obtained. In the present invention, $ZrO_2$ means $ZrO_2$ with all the crystal systems such as tetragonal $ZrO_2$, monoclinic $ZrO_2$ and cubic $ZrO_2$. The ZrO contained in the cubic boron nitride sintered body of the present invention has a function of improving wear resistance. In addition, when the crystal system of the $ZrO_2$ contained in the cubic boron nitride sintered body of the present invention is either one of tetragonal or cubic, or in the state that both of which are intermixed, the cubic boron nitride sintered body with excellent toughness and improved fracture resistance can be obtained. Therefore, the crystal system of the $ZrO_2$ contained in the cubic boron nitride sintered body of the present invention is preferably either one of tetragonal and cubic or both of which are intermixed. The $ZrO_2$ contained in the cubic boron nitride sintered body of the present invention is preferably $ZrO_2$ obtained by adding $CeO_2$, $Y_2O_3$, MgO and/or CaO, etc. thereto.

The Zr compound contained in the cubic boron nitride sintered body of the present invention is a compound in which, in an X-ray diffraction measurement, when a peak intensity of a (111) plane of the ZrO is represented as $I_1$, a peak intensity of a (101) plane of the tetragonal $ZrO_2$ is represented as $I_{2t}$, and a peak intensity of a (111) plane of the cubic $ZrO_2$ is represented as $I_{2c}$, a ratio $[I_1/(1+I_{2t}+I_{2c})]$ of the intensity of $I_1$ based on a sum of the intensities of $I_1$, $I_{2t}$ and $I_{2c}$ is 0.6 or more and 1.0 or less. If the $I_1/(I_1+I_{2t}+I_{2c})$ is less than 0.6, an amount of the ZrO is a little so that wear resistance is lowered. The $I_1/(I_1+I_{2t}+I_{2c})$ does not become large exceeding 1.0, so that the upper limit is made 1.0.

In the present invention, the sum of the peak intensities of the (111) plane of the ZrO, the (101) plane of the tetragonal $ZrO_2$ and the (111) plane of the cubic $ZrO_2$ corresponds to the value in which the peak intensity of the (111) plane of the ZrO, the peak intensity of the (101) plane of the tetragonal $ZrO_2$, and the peak intensity of the (111) plane of the cubic $ZrO_2$ are summed. For example, according to JCPDS card No. 51-1149, a diffraction peak of a diffraction angle 2θ of the (111) plane of the ZrO exists at around 33.5°. According to JCPDS card No. 72-2743, the (101) plane of the tetragonal $ZrO_2$ has a diffraction peak of a diffraction angle 2θ at around 30.18°. Further, according to JCPDS card No. 49-1642, the (111) plane of the cubic $ZrO_2$ has a diffraction peak of a diffraction angle 2θ at around 30.12°.

The crystal structure of the $Al_2O_3$ contained in the cubic boron nitride sintered body of the present invention is preferably α-$Al_2O_3$. This is because, in this case, wear by chemical reaction can be suppressed in the processing of a hard-to-cut material using the cubic boron nitride sintered body. Also, the α-$Al_2O_3$ contained in the cubic boron nitride sintered body of the present invention is preferably a material in which in the X-ray diffraction measurement, when the peak intensity of the (110) plane of the α-$Al_2O_3$ is represented as $I_3$, a ratio [$I_1/I_3$] of the intensity of $I_1$ based on the intensity of $I_3$ is preferably 0.3 or more and 0.8 or less. If the $I_1/I_3$ is less than 0.3, an amount of the ZrO is a little so that wear resistance and fracture resistance of the cubic boron nitride sintered body is lowered in some cases. If the $I_1/I_3$ becomes large exceeding 0.8, an amount of the α-$Al_2O_3$ is relatively little so that thermal conductivity of the cubic boron nitride sintered body is lowered. Therefore, fracture is generated in some cases to the cubic boron nitride sintered body due to wear by chemical reaction.

According to JCPDS card No. 83-2080, a diffraction peak of a diffraction angle 2θ of the (110) plane of the α-$Al_2O_3$ contained in the cubic boron nitride sintered body of the present invention exists at around 37.76°.

The X-ray diffraction intensities of the ZrO, the tetragonal $ZrO_2$, the cubic $ZrO_2$ and the α-$Al_2O_3$ contained in the cubic boron nitride sintered body of the present invention can be measured by using a commercially available X-ray diffraction device. For example, an X-ray diffraction device RINT TTRIII manufactured by Rigaku Corporation can be used. When this device is used, the X-ray diffraction measurement of a 2θ/θ concentrated optical system using a Cu-Kα line can be carried out under the conditions of output: 50 kV and 250 mA, solar slit at incident side: 5°, divergence vertical slit: 1/2°, divergence vertical limit slit: 10 mm, scattering slit 2/3°, solar slit at photoreception side: 5°, photoreception slit: 0.15 mm, BENT monochromator, photoreception monochrome slit: 0.8 mm, sampling width: 0.02°, scanning speed: 1°/min, and diffraction angle 2θ measurement range: 20 to 500. According to these conditions, the X-ray diffraction intensities can be measured with regard to the diffraction lines of the (111) plane of the tetragonal ZrO, the (101) plane of the tetragonal $ZrO_2$, the (111) plane of the cubic $ZrO_2$ and the (110) plane of the α-$Al_2O_3$. When the peak intensities of the above-described respective diffraction peaks are obtained from the obtained X-ray diffraction pattern, an analyzing software attached to the X-ray diffraction device may be used. In the analyzing software, the peak intensities of the respective diffraction peaks can be obtained by subjecting to removal of the background from the respective diffraction peaks by using cubic approximation and by performing profile fitting using a Pearson-VII function.

The Zr compound contained in the cubic boron nitride sintered body of the present invention is preferably contained in an amount of 1% by volume or more and 10% by volume or less based on the whole cubic boron nitride sintered body. If the amount of the Zr compound contained in the cubic boron nitride sintered body is less than 1% by volume, wear resistance and fracture resistance of the cubic boron nitride sintered body tend to be lowered. If the amount of the Zr compound contained in the cubic boron nitride sintered body becomes large exceeding 10% by volume, thermal conductivity of the cubic boron nitride sintered body tends to be lowered. Therefore, by proceeding wear by chemical reaction of the cubic boron nitride sintered body, strength of the blade edge is insufficient so that fracture is generated in some cases.

An average particle size of the cubic boron nitride contained in the cubic boron nitride sintered body of the present invention, is preferably 0.2 μm or more and 2.0 μm or less. If the average particle size of the cubic boron nitride is less than 0.2 μm, the structure of the sintered body becomes non-uniform by agglomerating the cubic boron nitride so that fracture resistance is lowered in some cases. If the average particle size of the cubic boron nitride exceeds 2.0 μm, the average thickness of the binder phase is increased whereby brittle fracture in the binder phase of the cubic boron nitride sintered body is likely caused so that fracture resistance is lowered in some cases. Among these, the average particle size of the cubic boron nitride is further preferably 0.2 μm or more and 1.2 μm or less.

Impurities (inevitable impurities) inevitably contained in the cubic boron nitride sintered body of the present invention may be lithium, etc., contained in starting powders, etc. A total amount of the inevitable impurities can be, in general, suppressed to 1% by mass or less based on the whole cubic boron nitride sintered body. Therefore, it is extremely rare that the inevitable impurities affect to the characteristic value of the cubic boron nitride sintered body of the present invention.

"% by volume" of the cubic boron nitride, the binder phase and the Zr compound of the present invention can be obtained from a structural photograph of the cubic boron nitride sintered body photographed by a scanning electron microscope (SEM) by analyzing with a commercially available image analyzing software. More specifically, the surface or an arbitrary cross-section of the cubic boron nitride sintered body is mirror polished, and a reflected electron image of the polished surface of the cubic boron nitride sintered body is observed by using the SEM. The polished surface of the cubic boron nitride sintered body magnified to 5,000 to 20,000-fold by using the SEM is observed with the reflected electron image. When it is observed by using an energy dispersive X-ray spectrometer (EDS) attached to the SEM, it can be identified that the black area is the cubic boron nitride, and the grey area and the white area are the binder phase. It can be further identified that the white area is the Zr compound and the grey area is the Al compound. Thereafter, a structural photograph is photographed by using the SEM. Occupied areas of the cubic boron nitride, the binder phase and the Zr compound are obtained from the obtained structural photograph, respectively, by using a commercially available image analyzing software. Ratios of the values of the occupied areas of the cubic boron nitride, the binder phase and the Zr compound thus obtained are the ratios of the volume contents. The composition of the binder phase can be identified by an X-ray diffraction device.

An average particle size of the cubic boron nitride of the present invention can be obtained from the structural photograph of the cubic boron nitride sintered body photographed by the SEM by analyzing with a commercially available image analyzing software. More specifically, the surface or an arbitrary cross-section of the cubic boron nitride sintered body is mirror polished, and a reflected electron image of the polished surface of the cubic boron nitride sintered body is observed by using the SEM. The structural photograph of the cubic boron nitride sintered body magnified to 5,000 to 20,000-fold is photographed by using the SEM. A diameter of a circle having an area equal to the area of the cubic boron nitride in the obtained structural photograph is obtained by using a commercially available image analyzing software. The diameter of the circle is made the particle size of the cubic boron nitride. Next, an average particle size of the cubic boron nitride can be obtained by calculating an average value of the particle sizes of the cubic boron nitride existing in the cross-sectional structure thus obtained. At this time, the average particle size of the cubic boron nitride can be analyzed in accordance with ASTM E 112-96.

The average grain size of the Al compound contained in the cubic boron nitride sintered body of the present invention can be obtained from the structural photograph of the cubic boron nitride sintered body photographed by the SEM by analyzing with a commercially available image analyzing software. The average grain size of the Al compound is obtained by measuring the Al compound from the sintered body structure after subjecting to thermal etching. By subjecting to thermal etching at a temperature lower than that of the sintering temperature, the average grain size of the Al compound can be observed. More specifically, the surface or an arbitrary cross-section of the cubic boron nitride sintered body is mirror polished, then, thermal etching thereof is carried out by using a vacuum sintering furnace under the conditions of a pressure of $3.0 \times 10^{-3}$ Pa to $6.3 \times 10^{-3}$ Pa, a temperature of 1000° C. to 1250° C. and a retention time of 30 to 60 minutes. A reflected electron image of the polished surface of the cubic boron nitride sintered body subjected to thermal etching is observed by using the SEM. A structural photograph of the cubic boron nitride sintered body magnified to 20,000 to 50,000-fold is photographed by using the SEM. A diameter of a circle having an area equal to the area of the Al compound is made a particle size of the Al compound from the obtained structural photograph using a commercially available image analyzing software. Next, the average grain size of the Al compound can be obtained by calculating an average value of the particle sizes of the Al compound existing in the cross-sectional structure thus obtained. At this time, the average grain size of the Al compound is analyzed in accordance with ASTM E 112-96.

The mirror polished surface of the cubic boron nitride sintered body is a surface of the cubic boron nitride sintered body obtained by subjecting to mirror polishing the surface or an arbitrary cross-section of the cubic boron nitride sintered body. A method for obtaining the mirror polished surface of the cubic boron nitride sintered body may be, for example, a method of polishing using a diamond paste.

It is preferred to form a film onto the surface of the cubic boron nitride sintered body to improve wear resistance. A material in which a film is formed onto the surface of the cubic boron nitride sintered body is called as a coated cubic boron nitride sintered body.

The film of the coated cubic boron nitride sintered body of the present invention (hereinafter simply referred to as "the film of the present invention".) is not particularly limited as long as it is used as a film of a coated tool. The film of the present invention is preferably a layer of a compound containing a first element and a second element. The film of the present invention is preferably a single layer or a laminated layer containing a plural number of layers. The first element is preferably at least one element selected from the group consisting of Ti, Zr, Hf, V, Nb, Ta, Cr, Mo, W, Y, Al and Si. The second element is preferably at least one element selected from the group consisting of C, N, O and B. When the film has such a constitution, wear resistance of the coated tool using the coated cubic boron nitride sintered body is improved.

Examples of the film of the present invention may be TiN, TiC, TiCN, TiAlN, TiSiN and CrAlN, etc. The film may be either of a single layer or a laminated layer containing two or more layers. The film preferably has a structure in which a plural number of layers with different compositions are laminated alternately. When the film has a laminated structure, an average film thickness of the respective layers is preferably 5 nm or more and 500 nm or less.

The average layer thickness of the whole film of the coated cubic boron nitride sintered body of the present invention, is preferably 0.5 μm or more and 20 μm or less. If the average film thickness of the whole film is less than 0.5 μm, wear resistance of the coated cubic boron nitride sintered body is lowered. If the average film thickness of the whole film exceeds 20 μm, fracture resistance of the coated cubic boron nitride sintered body is lowered.

A film thickness of the respective films constituting the film in the coated cubic boron nitride sintered body of the present invention can be measured, for example, from the cross-sectional structure of the coated cubic boron nitride sintered body by using an optical microscope, SEM, a transmission type electron microscope (TEM), etc. The average film thickness of the respective films constituting the film in the coated cubic boron nitride sintered body of the present invention can be obtained as follows. First, a film thickness of the respective films and a thickness of the respective laminated structures are measured from three or more cross-sectional shapes at the neighbors of the positions at 50 μm from a blade edge of a surface opposing to a metal evaporation source toward the center portion of the surface. Next, an average value of the measured film thicknesses of the respective films is calculated whereby an average film thickness of the respective films can be obtained.

Also, the composition of the respective films constituting the film in the coated cubic boron nitride sintered body of the present invention can be measured from the cross-sectional structure of the coated cubic boron nitride sintered body of the present invention by using the EDS or a wavelength dispersive X-ray spectroscopic device (WDS), etc.

A process for producing the film in the coated cubic boron nitride sintered body of the present invention is not particularly limited. It may be formed, for example, by using a physical deposition method such as an ion plating method, an arc ion plating method, a sputtering method and an ion mixing method, etc. Among these, when the arc ion plating method is used, a coated cubic boron nitride sintered body with excellent adhesiveness between the film and the base material, can be obtained. Therefore, it is more preferred to form the film by using the arc ion plating method.

The process for producing the cubic boron nitride sintered body of the present embodiment contains, Process (A): a process for formulating 60 to 80% by volume of $ZrO_2$ powder having an average particle size of 0.2 to 2.0 μm, and 20 to 40% by volume of powder of an Al metal having an average particle size of 0.5 to 5.0 μm (provided that the sum of these is 100% by volume), Process (B): a first mixing process in which the starting powders formulated in the above-described Process (A) is mixed by a wet ball mill using balls made of $ZrO_2$ for 5 to 48 hours to prepare a mixture, Process (C): a pressing process for obtaining a pressed body by pressing the obtained mixture to a predetermined shape and temporary sintering, Process (D): a first sintering process in which the pressed body obtained in the above-described Process (C) is charged in a sintering furnace, and sintered by maintaining in an Ar atmosphere at 0.1 to $250.0 \times 10^6$ Pa and a sintering temperature in the range of 1600 to 1800° for 60 minutes, Process (E): a pulverizing process in which the composite obtained in the above-described Process (D) is pulverized in a mortar made of cemented carbide to prepare composite powder, Process (F): a pulverizing process in which the composite powder obtained in the above-described Process (E) is pulverized by a wet ball mill using balls made of cemented carbide for 24 to 96 hours to make the composite powder finer particles, Process (G): a process of removing the cemented carbide derived from the cemented carbide by separating the composite powder obtained from the above-described Process (F) by the specific gravity, thereafter, subjected to the acid treatment, Process (H): a process in which 1 to 10% by volume of the composite powder obtained from the above-described Process (G), 40 to 85% by volume of the cubic boron nitride having an average particle size of 0.2 to 2.0 µm, 14 to 50% by volume of at least one kind of powder selected from the group consisting of a nitride, an oxide and a boride of an Al element having an average particle size of 0.05 to 3.0 µm, and 3 to 13% by volume of an Al powder having an average particle size of 0.5 to 5.0 jam are formulated (provided that the sum of these is 100% by volume), Process (I): a second mixing process in which the starting powder formulated in the above-described Process (H) is mixed by a wet ball mill using balls made of $Al_2O_3$ for 5 to 24 hours to prepare a mixture, Process (J): a pressing process in which the obtained mixture is pressed to a predetermined shape to obtain a pressed body, and Process (K): a second sintering process in which the pressed body obtained in the above-described Process (J) is charged in an ultra-high pressure generating device, and sintered by maintaining at a pressure of 4.5 to 6.0 GPa and a sintering temperature in the range of 1300 to 1500° for a predetermined time.

The respective Processes of the producing process of the cubic boron nitride sintered body of the present invention have the following meanings.

In Process (A), composite powder containing $ZrO_2$ and an Al metal can be produced. Among these, when $ZrO_2$ powder obtained by adding $CeO_2$, $Y_2O_3$, MgO, and/or CaO, etc., thereto is used as the $ZrO_2$, tetragonal or cubic that is excellent in toughness can be formed. When the average particle size of the primary particles of the $ZrO_2$ powder is 30 to 50 nm, there is an effect that fine $ZrO_2$ is easily dispersed in the structure of the cubic boron nitride sintered body. However, from easiness in handling, $ZrO_2$ powder which is secondary particles having an average particle size of 0.1 to 2 µm in which primary particles of the $ZrO_2$ having an average particle size of 30 to 50 nm had been agglomerated is preferably used.

In Process (B), agglomeration of the $ZrO_2$ and the Al metal is prevented, and these can be uniformly mixed.

In Process (C), the obtained mixture is pressed to a predetermined shape and temporary sintered. The obtained pressed body is sintered in the following sintering process.

In Process (D), the pressed body can be sintered. By sintering the $ZrO_2$ and the Al powder at a high temperature, a composite body containing ZrO can be produced. This can be considered that the ZrO is formed by causing the reaction in the following formula (1). Therefore, in Process (A), by adjusting the ratio of the $ZrO_2$ and the Al metal, a ratio of forming the ZrO can be controlled.

$$3ZrO_2 + 2Al \rightarrow 3ZrO + Al_2O_3 \tag{1}$$

In the composite body obtained from Process (D), the average particle size of $Al_2O_3$ becomes larger than 0.3 µm by sintering at a high temperature. Therefore, the composite body obtained in Process (D) can be pulverized to composite powder having a smaller granularity in Process (E) and Process (F).

In Process (G), the cemented carbide is removed so that purity of the composite powder can be heightened.

In Process (H), the composition of the cubic boron nitride sintered body can be adjusted. In addition, the particle size of the cubic boron nitride can be adjusted. Other than the above-described powder shown in Process (H), compound powder comprising at least one or more element selected from the group consisting of Ti, Hf, V, Nb, Ta, Cr, Mo, W and Co, and at least one or more elements selected from the group consisting of C, N, O and B may be formulated for the purpose of improving wear resistance.

In Process (I), mixed powders with a predetermined formulation composition can be uniformly mixed.

In Process (J), the obtained mixture is pressed to a predetermined shape. The obtained pressed body is sintered in the following sintering process.

In Process (K), a cubic boron nitride sintered body in which a coarse grain of the Al compound is suppressed can be produced by sintering at a pressure of 4.5 to 6.0 GPa and a temperature in the range of 1300 to 1500° C.

Grinding processing and/or honing processing of the blade edge may be applied to the cubic boron nitride sintered body obtained through Process (A) to Process (K), depending on necessity. The coated cubic boron nitride sintered body can be produced by forming a film onto the produced cubic boron nitride sintered body by using the physical vapor deposition method.

The cubic boron nitride sintered body and the coated cubic boron nitride sintered body of the present invention are excellent in wear resistance and fracture resistance, so that these are preferably applied to a cutting tool or a wear resistant tool. Above all, the cubic boron nitride sintered body and the coated cubic boron nitride sintered body of the present invention are further preferably applied to a cutting tool.

EXAMPLES

Example 1

By using $ZrO_2$ (PSZ) powder having an average particle size 0.6 µm which had been produced by agglomerating $ZrO_2$ particles (primary particles) having an average particle size 40 nm in which 3 mol % of $Y_2O_3$ had been added based on the whole $ZrO_2$, $ZrO_2$ (FSZ) powder having an average particle size 0.6 µm which had been produced by agglomerating $ZrO_2$ particles (primary particles) having an average particle size 40 nm in which 10 mol % of $Y_2O_3$ had been added based on the whole $ZrO_2$, and Al powder having an average particle size 4.0 µm, these were formulated to the formulation composition shown in Table 1. With regard to Comparative products 1 to 4, 8 and 10, composite body powder was not produced.

TABLE 1

| Sample No. | Formulation composition (% by volume) | | |
|---|---|---|---|
|  | PSZ | FSZ | Al |
| Present product 1 | 70 | 0 | 30 |
| Present product 2 | 35 | 35 | 30 |
| Present product 3 | 70 | 0 | 30 |
| Present product 4 | 70 | 0 | 30 |
| Present product 5 | 0 | 70 | 30 |
| Present product 6 | 70 | 0 | 30 |
| Present product 7 | 70 | 0 | 30 |
| Present product 8 | 70 | 0 | 30 |
| Present product 9 | 70 | 0 | 30 |
| Present product 10 | 60 | 0 | 40 |
| Present product 11 | 70 | 0 | 30 |
| Present product 12 | 60 | 0 | 40 |
| Present product 13 | 70 | 0 | 30 |
| Present product 14 | 80 | 0 | 20 |

TABLE 1-continued

| Sample No. | Formulation composition (% by volume) | | |
|---|---|---|---|
| | PSZ | FSZ | Al |
| Present product 15 | 60 | 0 | 40 |
| Comparative product 1 | | Not formulated | |
| Comparative product 2 | | Not formulated | |
| Comparative product 3 | | Not formulated | |
| Comparative product 4 | | Not formulated | |
| Comparative product 5 | 70 | 0 | 30 |
| Comparative product 6 | 70 | 0 | 30 |
| Comparative product 7 | 90 | 0 | 10 |
| Comparative product 8 | | Not formulated | |
| Comparative product 9 | 70 | 0 | 30 |
| Comparative product 10 | | Not formulated | |

The formulated starting powders were charged in a cylinder for ball mill with balls made of $ZrO_2$ and a hexane solvent to carry out ball mill mixing for 24 hours. The mixed powder obtained by mixing with the ball mill was subjected to compression pressing, and then, to temporary sintering under the conditions of $1.33 \times 10^{-3}$ Pa at 750° C.

With regard to Present products 1 to 10 and Comparative products 5 to 7 and 9, the materials were maintained in an Ar atmosphere of $1.0 \times 10^5$ Pa and at the sintering temperature of 1,700° C. for 60 minutes to obtain the respective sintered bodies. With regard to Present products 11 to 15, the materials were maintained in an Ar atmosphere of $1.0 \times 10^5$ Pa at the sintering temperature of 1,800° C. for 60 minutes to obtain the respective sintered bodies.

The obtained respective sintered bodies were pulverized by a mortar made of cemented carbide to produce respective composite powders. Thereafter, the respective composite powders were each charged in a cylinder for ball mill with balls made of cemented carbide and a hexane solvent and subjected to ball mill pulverization for 48 hours.

Moreover, the obtained respective composite mixtures were each separated by specific gravity. Thereafter, these were subjected to an acid treatment to remove the cemented carbide mixed in the respective composite mixtures.

By using the composite powders obtained by the above Processes, the cBN powder having an average particle size of 0.2, 0.4, 1.2, 2.0 and 3.8 μm, the PSZ powder having an average particle size of 0.6 μm, the ZrC powder having an average particle size of 0.6 μm, the ZrN powder having an average particle size of 0.6 μm, the $ZrB_2$ powder having an average particle size of 0.6 μm, the TiN powder having an average particle size of 0.4 μm, the SiC powder having an average particle size of 3.0 μm, the $Al_2O_3$ powder having an average particle size of 0.1 μm and the Al powder having an average particle size of 4.0 μm, these were formulated to the formulation composition as shown in Table 2.

TABLE 2

| | Formulation composition | | | | | | |
|---|---|---|---|---|---|---|---|
| | Composite body powder | | Binder phase | | | | |
| | | cBN | $Al_2O_3$ | Al | PSZ | Other compounds | |
| Sample No. | (% by volume) | (% by volume) | (% by volume) | (% by volume) | (% by volume) | Composition | (% by volume) |
| Present product 1 | 2.4 | 40.0 | 53.6 | 4.0 | 0.0 | — | 0.0 |
| Present product 2 | 1.5 | 50.0 | 44.5 | 4.0 | 0.0 | — | 0.0 |
| Present product 3 | 2.3 | 65.0 | 28.7 | 4.0 | 0.0 | — | 0.0 |
| Present product 4 | 1.9 | 65.0 | 27.6 | 4.0 | 0.0 | ZrC | 1.5 |
| Present product 5 | 1.9 | 65.0 | 27.6 | 4.0 | 0.0 | ZrN | 1.5 |
| Present product 6 | 4.4 | 65.0 | 22.6 | 8.0 | 0.0 | — | 0.0 |
| Present product 7 | 3.0 | 65.0 | 26.8 | 4.0 | 0.0 | $ZrB_2$ | 1.2 |
| Present product 8 | 2.2 | 65.0 | 28.8 | 4.0 | 0.0 | — | 0.0 |
| Present product 9 | 11.6 | 75.0 | 9.4 | 4.0 | 0.0 | — | 0.0 |
| Present product 10 | 1.5 | 85.0 | 1.5 | 12.0 | 0.0 | — | 0.0 |
| Present product 11 | 2.2 | 65.0 | 28.8 | 4.0 | 0.0 | — | 0.0 |
| Present product 12 | 2.5 | 65.0 | 25.5 | 4.0 | 0.0 | TiN | 3.0 |
| Present product 13 | 2.2 | 65.0 | 25.8 | 4.0 | 0.0 | SiC | 3.0 |
| Present product 14 | 2.1 | 65.0 | 28.9 | 4.0 | 0.0 | — | 0.0 |
| Present product 15 | 2.5 | 65.0 | 28.5 | 4.0 | 0.0 | — | 0.0 |
| Comparative product 1 | 0.0 | 65.0 | 29.1 | 4.0 | 0.9 | $ZrB_2$ | 1.0 |
| Comparative product 2 | 0.0 | 65.0 | 29.1 | 4.0 | 0.9 | ZrN | 1.0 |
| Comparative product 3 | 0.0 | 65.0 | 30.4 | 4.0 | 0.3 | ZrC | 0.3 |
| Comparative product 4 | 0.0 | 65.0 | 25.0 | 4.0 | 6.0 | — | 0.0 |
| Comparative product 5 | 8.1 | 30.0 | 57.9 | 4.0 | 0.0 | — | 0.0 |
| Comparative product 6 | 1.3 | 92.0 | 2.7 | 4.0 | 0.0 | — | 0.0 |
| Comparative product 7 | 2.0 | 65.0 | 29.0 | 4.0 | 0.0 | — | 0.0 |
| Comparative product 8 | 0.0 | 65.0 | 31.0 | 4.0 | 0.0 | — | 0.0 |
| Comparative product 9 | 21.4 | 65.0 | 9.6 | 4.0 | 0.0 | — | 0.0 |
| Comparative product 10 | 0.0 | 65.0 | 0.0 | 0.0 | 10.0 | TiN | 25.0 |

The formulated starting powders were charged in a cylinder for ball mill with balls made of $Al_2O_3$ and a hexane solvent, and subjected to ball mill mixing. The mixed powders obtained by subjecting to ball mill mixing were subjected to compression pressing, and then, to temporary sintering under the conditions of $1.33\times10^{-3}$ Pa at 750°. These temporary sintered bodies were charged in an ultra-high pressure and high temperature generating device, and sintered under the conditions shown in Table 3 to obtain cubic boron nitride sintered bodies of Present products and Comparitive products.

TABLE 3

| Sample No. | Sintering temperature (° C.) | Sintering pressure (GPa) |
|---|---|---|
| Present product 1 | 1300 | 5.5 |
| Present product 2 | 1350 | 4.5 |
| Present product 3 | 1300 | 5.5 |
| Present product 4 | 1400 | 5.5 |
| Present product 5 | 1400 | 5.5 |
| Present product 6 | 1500 | 6.0 |
| Present product 7 | 1500 | 6.0 |
| Present product 8 | 1400 | 5.5 |
| Present product 9 | 1400 | 5.5 |
| Present product 10 | 1450 | 6.0 |
| Present product 11 | 1500 | 5.0 |
| Present product 12 | 1500 | 5.0 |
| Comparative product 1 | 1300 | 4.5 |
| Comparative product 2 | 1350 | 5.5 |
| Comparative product 3 | 1400 | 6.0 |
| Comparative product 4 | 1700 | 5.5 |
| Comparative product 5 | 1400 | 5.5 |
| Comparative product 6 | 1500 | 5.5 |
| Comparative product 7 | 1400 | 5.0 |
| Comparative product 8 | 1450 | 5.5 |
| Comparative product 9 | 1300 | 4.5 |
| Comparative product 10 | 1400 | 4.0 |

The thus obtained cubic boron nitride sintered bodies were subjected to X-ray diffraction measurement to examine the composition of the respective cubic boron nitride sintered bodies. As a result, Present product 2 was confirmed that the crystal system of the $ZrO_2$ is in an intermixed state of both of the tetragonal and the cubic. Present product 5 was confirmed that the crystal system of the $ZrO_2$ is the cubic. Also, the cross-sectional structures of the cubic boron nitride sintered bodies were photographed by SEM, and % by volume of the cBN, % by volume of the binder phase and % by volume of the Zr compound of the photographed cross-sectional structural photographs were measured by using commercially available image analyzing software. These results are shown in Table 4.

TABLE 4

| | Cubic boron nitride sintered body | | | | | | | |
|---|---|---|---|---|---|---|---|---|
| | cBN | Binder phase | | | | | | |
| | | Al compound | | Zr compound | | Other compound(s) | | |
| Sample No. | (% by volume) | Composition | (% by volume) | Composition | (% by volume) | Composition | (% by volume) | |
| Present product 1 | 40.0 | $Al_2O_3$ | 58.0 | $ZrO, ZrO_2$ | 2.0 | — | 0.0 | |
| Present product 2 | 50.0 | $Al_2O_3$ | 48.7 | $ZrO, ZrO_2$ | 1.3 | — | 0.0 | |
| Present product 3 | 65.0 | $Al_2O_3$ | 33.1 | $ZrO, ZrO_2$ | 1.9 | — | 0.0 | |
| Present product 4 | 65.0 | $Al_2O_3$ | 31.9 | $ZrO, ZrO_2, ZrB_2, ZrC$ | 3.1 | — | 0.0 | |
| Present product 5 | 65.0 | $Al_2O_3$ | 31.9 | $ZrO, ZrO_2, ZrB_2, ZrN$ | 3.1 | — | 0.0 | |
| Present product 6 | 65.0 | $Al_2O_3$, AlN, $AlB_2$ | 31.3 | $ZrO, ZrO_2$ | 3.7 | — | 0.0 | |
| Present product 7 | 65.0 | $Al_2O_3$ | 31.3 | $ZrO, ZrO_2, ZrB_2$ | 3.7 | — | 0.0 | |
| Present product 8 | 65.0 | $Al_2O_3$ | 33.1 | $ZrO, ZrO_2$ | 1.9 | — | 0.0 | |
| Present product 9 | 75.0 | $Al_2O_3$ | 15.2 | $ZrO, ZrO_2, ZrB_2$ | 9.8 | — | 0.0 | |
| Present product 10 | 85.0 | $Al_2O_3$, AlN, $AlB_2$ | 13.9 | $ZrO$ | 1.1 | — | 0.0 | |
| Present product 11 | 65.0 | $Al_2O_3$ | 33.1 | $ZrO, ZrO_2$ | 1.9 | — | 0.0 | |
| Present product 12 | 65.0 | $Al_2O_3$ | 30.1 | $ZrO, ZrO_2$ | 1.9 | TiN | 3.0 | |
| Present product 13 | 65.0 | $Al_2O_3$ | 30.1 | $ZrO, ZrO_2$ | 1.9 | SiC | 3.0 | |
| Present product 14 | 65.0 | $Al_2O_3$ | 33.1 | $ZrO, ZrO_2$ | 1.9 | — | 0.0 | |
| Present product 15 | 65.0 | $Al_2O_3$ | 33.1 | $ZrO$ | 1.9 | — | 0.0 | |
| Comparative product 1 | 65.0 | $Al_2O_3$ | 33.1 | $ZrO_2, ZrB_2$ | 1.9 | — | 0.0 | |
| Comparative product 2 | 65.0 | $Al_2O_3$ | 33.1 | $ZrO_2, ZrN$ | 1.9 | — | 0.0 | |
| Comparative product 3 | 65.0 | $Al_2O_3$ | 34.4 | $ZrO_2, ZrC$ | 0.6 | — | 0.0 | |
| Comparative product 4 | 65.0 | $Al_2O_3$ | 29.0 | $ZrO, ZrO_2$ | 6.0 | — | 0.0 | |
| Comparative product 5 | 30.0 | $Al_2O_3$ | 63.2 | $ZrO, ZrO_2$ | 6.8 | — | 0.0 | |
| Comparative product 6 | 92.0 | $Al_2O_3$ | 6.9 | $ZrO, ZrO_2$ | 1.1 | — | 0.0 | |
| Comparative product 7 | 65.0 | $Al_2O_3$ | 33.1 | $ZrO, ZrO_2$ | 1.9 | — | 0.0 | |

TABLE 4-continued

<table>
<tr><th rowspan="3">Sample No.</th><th colspan="7">Cubic boron nitride sintered body</th></tr>
<tr><th>cBN</th><th colspan="6">Binder phase</th></tr>
<tr><th></th><th colspan="2">Al compound</th><th colspan="2">Zr compound</th><th colspan="2">Other compound(s)</th></tr>
<tr><td></td><td>(% by volume)</td><td>Composition</td><td>(% by volume)</td><td>Composition</td><td>(% by volume)</td><td>Composition</td><td>(% by volume)</td></tr>
<tr><td>Comparative product 8</td><td>65.0</td><td>Al$_2$O$_3$</td><td>35.0</td><td>—</td><td>0.0</td><td>—</td><td>0.0</td></tr>
<tr><td>Comparative product 9</td><td>65.0</td><td>Al$_2$O$_3$</td><td>17.0</td><td>ZrO, ZrO$_2$</td><td>18.0</td><td>—</td><td>0.0</td></tr>
<tr><td>Comparative product 10</td><td>65.0</td><td>—</td><td>0.0</td><td>ZrO$_2$</td><td>10.0</td><td>TiN</td><td>25.0</td></tr>
</table>

Peak heights of the diffraction lines of the obtained cubic boron nitride sintered bodies were measured by using an X-ray diffraction device RINT TTRIII manufactured by Rigaku Corporation. The measurement conditions were made output: 50 kV and 250 mA, solar slit at incident side: 5°, divergence vertical slit: 1/2°, divergence vertical limit slit: 10 mm, scattering slit 2/3°, solar slit at photoreception side: 5°, photoreception slit: 0.15 mm, BENT monochromator, photoreception monochrome slit: 0.8 mm, sampling width: 0.02°, scanning speed: 1°/min, and 2θ measurement range: 20 to 50°. Under the above-described measurement conditions, an X-ray diffraction measurement of the cubic boron nitride sintered body was carried out by a 2θ/θ concentrated optical system using a Cu-Kα line. From the obtained X-ray diffraction pattern, an X-ray diffraction intensity $I_1$ of the (111) plane of the ZrO, an X-ray diffraction intensity $I_{2t}$ of the (101) plane of the tetragonal ZrO$_2$, an X-ray diffraction intensity $I_{2c}$ of the (111) plane of the cubic ZrO$_2$ and an X-ray diffraction intensity $I_3$ of the (110) plane of the α-Al$_2$O$_3$ were measured. In the FIGURE, the pattern of the X-ray diffraction measurement result of Present product 7 is shown as an example. The (101) plane of the tetragonal ZrO$_2$ was represented as t-ZrO$_2$ (101) and the (111) plane of the cubic ZrO$_2$ was represented as c-ZrO$_2$ (111). Thereafter, a ratio [$I_1/(I_1+I_{2t}+I_{2c})$] of the peak intensity of $I_1$ based on the sum of the peak intensities of $I_1$, $I_{2t}$ and $I_{2c}$, and a ratio [$I_1/I_3$] of the peak intensity of $I_1$ based on the sum of the peak intensities of $I_3$ were obtained, respectively. These values are shown in Table 5.

TABLE 5

| Sample No. | $I_1/(I_1 + I_{2t} + I_{2c})$ | $I_1/I_3$ |
| --- | --- | --- |
| Present product 1 | 0.77 | 0.41 |
| Present product 2 | 0.75 | 0.43 |
| Present product 3 | 0.79 | 0.48 |
| Present product 4 | 0.80 | 0.45 |
| Present product 5 | 0.77 | 0.50 |
| Present product 6 | 0.72 | 0.68 |
| Present product 7 | 0.80 | 0.51 |
| Present product 8 | 0.79 | 0.59 |
| Present product 9 | 0.75 | 0.58 |
| Present product 10 | 1.00 | 0.33 |
| Present product 11 | 0.70 | 0.62 |
| Present product 12 | 0.95 | 0.43 |
| Present product 13 | 0.65 | 0.51 |
| Present product 14 | 0.61 | 0.31 |
| Present product 15 | 1.00 | 0.78 |
| Comparative product 1 | 0.00 | 0.00 |
| Comparative product 2 | 0.00 | 0.00 |
| Comparative product 3 | 0.00 | 0.00 |
| Comparative product 4 | 0.62 | 0.14 |
| Comparative product 5 | 0.72 | 0.16 |
| Comparative product 6 | 0.75 | 0.07 |
| Comparative product 7 | 0.24 | 0.11 |
| Comparative product 8 | Zr compound is not contained | 0.00 |
| Comparative product 9 | 0.74 | 1.70 |
| Comparative product 10 | 0.00 | Al$_2$O$_3$ is not contained |

The average particle size of the cubic boron nitride of the obtained cubic boron nitride sintered body was obtained from the cross-sectional structural photograph photographed by the SEM using a commercially available image analyzing software. More specifically, 10,000-fold of the reflected electron image was observed by using the SEM, and by using EDS attached to the SEM, it was confirmed that the cubic boron nitride was black, the Al compound was grey and the Zr compound was white. Images of the cubic boron nitride sintered body were photographed by at least 10 visual fields or more with a magnification of 10,000-fold. Next, by using a commercially available image analyzing software, the value obtained in accordance with ASTM E 112-96 was made a particle size of the cubic boron nitride existing in the sintered body structure. These values are shown in Table 6.

TABLE 6

| Sample No. | Average particle size of cBN (μm) |
| --- | --- |
| Present product 1 | 0.4 |
| Present product 2 | 0.4 |
| Present product 3 | 1.2 |
| Present product 4 | 0.4 |
| Present product 5 | 0.4 |
| Present product 6 | 0.4 |
| Present product 7 | 0.2 |
| Present product 8 | 2.0 |
| Present product 9 | 0.2 |
| Present product 10 | 0.4 |
| Present product 11 | 0.4 |
| Present product 12 | 1.2 |
| Present product 13 | 1.2 |
| Present product 14 | 0.4 |
| Present product 15 | 0.4 |
| Comparative product 1 | 2.0 |
| Comparative product 2 | 3.8 |
| Comparative product 3 | 0.4 |
| Comparative product 4 | 0.4 |
| Comparative product 5 | 0.4 |
| Comparative product 6 | 0.4 |
| Comparative product 7 | 0.4 |
| Comparative product 8 | 0.4 |

TABLE 6-continued

| Sample No. | Average particle size of cBN (μm) |
|---|---|
| Comparative product 9 | 2.0 |
| Comparative product 10 | 1.2 |

The surface or an arbitrary cross-section of the obtained cubic boron nitride sintered body was mirror polished, and it was charged in a vacuum sintering furnace to carry out thermal etching. The thermal etching was carried out with the conditions at a pressure of $5.3 \times 10^{-3}$ Pa and a temperature of 1,050° C. by maintaining for 30 minutes. A reflected electron image of the polished surface of the cubic boron nitride sintered body subjected to thermal etching was observed by using the SEM. The structural photographs of the cubic boron nitride sintered body magnified to 30,000-fold were photographed by at least 10 visual fields or more by using the SEM. Thereafter, by a commercially available image analyzing software, the value obtained in accordance with ASTM E 112-96 was made a particle size of the Al compound existing in the sintered body structure. These results are shown in Table 7.

TABLE 7

| Sample No. | Average particle size of Al compound (nm) |
|---|---|
| Present product 1 | 100 |
| Present product 2 | 100 |
| Present product 3 | 80 |
| Present product 4 | 150 |
| Present product 5 | 150 |
| Present product 6 | 200 |
| Present product 7 | 200 |
| Present product 8 | 200 |
| Present product 9 | 200 |
| Present product 10 | 200 |
| Present product 11 | 300 |
| Present product 12 | 200 |
| Present product 13 | 200 |
| Present product 14 | 200 |
| Present product 15 | 200 |
| Comparative product 1 | 100 |
| Comparative product 2 | 100 |
| Comparative product 3 | 200 |
| Comparative product 4 | 450 |
| Comparative product 5 | 200 |
| Comparative product 6 | 200 |
| Comparative product 7 | 300 |
| Comparative product 8 | 300 |
| Comparative product 9 | 50 |
| Comparative product 10 | Al compound is not contained |

Present products and Comparative products were processed to a cutting tool having an ISO standard CNGA120408 insert shape. With regard to the obtained cutting tools, the following machining test was carried out. The results are shown in Table 8.

[Machining Test]
Outer periphery continuous machining (turning),
Work piece material: Inconel 718,
Shape of work piece material: cylindrical 120 mm (diameter)×350 mm,
Cutting speed: 270 m/min,
Depth of cut: 0.3 mm,
Feed: 0.18 mm/rev,
Coolant: wet,
Evaluation item: When the sample was fractured or the maximum flank wear width of which reached to 0.2 mm, it was judged as the tool life, and the machining time until reaching to the tool life was measured.

TABLE 8

| | Machining test | |
|---|---|---|
| Sample No. | Tool life (min) | Tool damaged form |
| Present product 1 | 7.2 | Normal wear |
| Present product 2 | 7.7 | Normal wear |
| Present product 3 | 8.2 | Normal wear |
| Present product 4 | 9.4 | Normal wear |
| Present product 5 | 9.3 | Normal wear |
| Present product 6 | 8.4 | Normal wear |
| Present product 7 | 10.8 | Normal wear |
| Present product 8 | 7.3 | Normal wear |
| Present product 9 | 9.3 | Normal wear |
| Present product 10 | 8.0 | Normal wear |
| Present product 11 | 7.9 | Normal wear |
| Present product 12 | 7.4 | Normal wear |
| Present product 13 | 7.6 | Normal wear |
| Present product 14 | 9.1 | Normal wear |
| Present product 15 | 9.8 | Normal wear |
| Comparative product 1 | 4.6 | Fracture |
| Comparative product 2 | 3.2 | Fracture |
| Comparative product 3 | 5.1 | Fracture |
| Comparative product 4 | 6.3 | Fracture |
| Comparative product 5 | 5.2 | Fracture |
| Comparative product 6 | 2.8 | Fracture |
| Comparative product 7 | 6.3 | Normal wear |
| Comparative product 8 | 3.3 | Fracture |
| Comparative product 9 | 1.4 | Fracture |
| Comparative product 10 | 0.5 | Fracture |

The cubic boron nitride sintered bodies of Present products were improved in wear resistance without lowering fracture resistance as compared to those of the cubic boron nitride sintered bodies of Comparative products. Accordingly, it can be said that Present products have longer tool life as compared to those of Comparative products.

Example 2

A coating treatment was carried out onto the surface of Present products 1 to 15 of Example 1 by using a PVD device. Those in which a TiN layer having an average layer thickness of 3 μm had been coated onto the surface of the cubic boron nitride sintered bodies of Present products 1 to 5 were made Present products 16 to 20, and those in which a TiAlN layer having an average layer thickness of 3 μm had been coated onto the surface of the cubic boron nitride sintered bodies of Present products 6 to 10 were made Present products 21 to 25. Those in which alternate lamination of TiAlN with 3 nm per a layer and TiAlNbWN with 3 nm per a layer being alternately laminated with each 500 layers had been coated onto the surface of the cubic boron nitride sintered bodies of Present products 11 to 15 were made Present products 26 to 30. With regard to Present products 16 to 30, the same machining test as in Example 1 was carried out. The results are shown in Table 9.

TABLE 9

| | Machining test | |
|---|---|---|
| Sample No. | Tool life (min) | Tool damaged form |
| Present product 16 | 9.0 | Normal wear |
| Present product 17 | 9.8 | Normal wear |
| Present product 18 | 10.2 | Normal wear |

TABLE 9-continued

| Sample No. | Machining test | |
|---|---|---|
| | Tool life (min) | Tool damaged form |
| Present product 19 | 11.1 | Normal wear |
| Present product 20 | 10.9 | Normal wear |
| Present product 21 | 10.5 | Normal wear |
| Present product 22 | 10.8 | Normal wear |
| Present product 23 | 9.6 | Normal wear |
| Present product 24 | 11.5 | Normal wear |
| Present product 25 | 10.4 | Normal wear |
| Present product 26 | 10.7 | Normal wear |
| Present product 27 | 10.0 | Normal wear |
| Present product 28 | 10.2 | Normal wear |
| Present product 29 | 11.6 | Normal wear |
| Present product 30 | 12.0 | Normal wear |

All of Present products 16 to 30 which had been covered by a coating layer could be further elongated their tool lives compared to those of Present products 1 to 12 which had not been covered by a coating layer.

INDUSTRIAL APPLICABILITY

The cubic boron nitride sintered body and the coated cubic boron nitride sintered body of the present invention is excellent in wear resistance, in particular, a tool life can be extended when these are used as a cutting tool and a wear resistant tool, so that their industrial applicability is high.

The invention claimed is:

1. A cubic boron nitride sintered body comprising:
a cubic boron nitride with 40% by volume or more and 85% by volume or less; a binder phase with 15% by volume or more and 60% by volume or less; and inevitable impurities, wherein
the binder phase comprises:
an Al compound comprising an Al element and at least one element selected from the group consisting of N, O and B; and
a Zr compound comprising a Zr element and an O element and at least one element selected from the group consisting of C, N and B,
the Zr compound comprises ZrO, or ZrO and $ZrO_2$,
when a peak intensity of a (111) plane of the ZrO is represented as $I_1$, a peak intensity of a (101) plane of tetragonal $ZrO_2$ is represented as $I_{2t}$, and a peak intensity of a (111) plane of cubic $ZrO_2$ is represented as $I_{2c}$ in an X-ray diffraction, a ratio $[I_1/(I_1+I_{2t}+I_{2c})]$ of the intensity of $I_1$ based on a sum of the intensities of $I_1$, $I_{2t}$ and $I_{2c}$ is 0.6 or more and 1.0 or less, and
an average grain size of the Al compound is 80 nm or more and 300 nm or less.

2. The cubic boron nitride sintered body according to claim 1, wherein
the Al compound comprises $Al_2O_3$,
a crystal structure of the $Al_2O_3$ is $\alpha$-$Al_2O_3$, and
when a peak intensity of a (110) plane of the $\alpha$-$Al_2O_3$ is represented as $I_3$ in an X-ray diffraction, a ratio $[I_1/I_3]$ of the intensity of I' based on the intensity of $I_3$ is 0.3 or more and 0.8 or less.

3. The cubic boron nitride sintered body according to claim 1, wherein the Zr compound is 1% by volume or more and 10% by volume or less based on the whole cubic boron nitride sintered body.

4. The cubic boron nitride sintered body according to claim 1, wherein an average particle size of the cubic boron nitride is 0.2 μm or more and 2.0 μm or less.

5. A coated cubic boron nitride sintered body comprising a film formed onto a surface of the cubic boron nitride sintered body according to claim 1.

6. The coated cubic boron nitride sintered body according to claim 5, wherein the film comprises at least one or more elements selected from the group consisting of Ti, Zr, Hf, V, Nb, Ta, Cr, Mo, W, Al and Si, and at least one or more elements selected from the group consisting of C, N, O and B.

7. The coated cubic boron nitride sintered body according to claim 5, wherein the film is a single layer film or a laminated film of two or more layers.

8. The coated cubic boron nitride sintered body according to claim 5, wherein a total film thickness of a whole film is 0.5 μm or more and 20 μm or less in terms of an average film thickness.

9. The coated cubic boron nitride sintered body according to claim 6, wherein a total film thickness of a whole film is 0.5 μm or more and 20 μm or less in terms of an average film thickness.

10. The coated cubic boron nitride sintered body according to claim 9, wherein the film is a single layer film.

11. The coated cubic boron nitride sintered body according to claim 9, wherein the film is a laminated film of two or more layers.

12. The cubic boron nitride sintered body according to claim 2, wherein the Zr compound is 1% by volume or more and 10% by volume or less based on the whole cubic boron nitride sintered body.

13. The cubic boron nitride sintered body according to claim 12, wherein an average particle size of the cubic boron nitride is 0.2 μm or more and 2.0 μm or less.

* * * * *